United States Patent

DeSimone et al.

[15] 3,704,384

[45] Nov. 28, 1972

[54] MONOLITHIC CAPACITOR STRUCTURE

[72] Inventors: Roy R. DeSimone, Wappingers Falls; Richard H. Linton, Poughkeepsie, both of N.Y.

[73] Assignee: International Business Machines Corporation, Armonk, N.Y.

[22] Filed: March 30, 1971

[21] Appl. No.: 129,497

[52] U.S. Cl. ................307/304, 307/303, 317/235 B

[51] Int. Cl. ..............................................H01l 11/14

[58] Field of Search .......317/235 B, 235 G; 307/303, 307/304

[56] References Cited

UNITED STATES PATENTS

| | | | |
|---|---|---|---|
| 3,560,815 | 2/1971 | Sigsbee | 317/235 |
| 3,621,347 | 11/1971 | Van Nielen | 317/235 R |

OTHER PUBLICATIONS

Netherlands application, 6808352, Dec. 16, 1969, Philips', 4 sheets of dwgs., 16 pp. spec.

*Primary Examiner*—Stanley T. Krawczewicz
*Attorney*—Hanifin & Jancin and James E. Murray

[57] ABSTRACT

This specification discloses a polarized capacitor for use in monolithic structures, particularly those using field effect transistors. One plate of this capacitor is a metal layer overlying and insulated from a semiconductor body which has a diffusion in it adjacent to the overlying metal layer. The boundaries of this diffusion form a rectifying junction with the rest of the semiconductor body. When a voltage is applied between the metal layer and the diffusion an electric field is formed under the layer and adjacent to the diffusion so as to create an inversion layer which forms with the diffusion the second plate of the capacitor.

2 Claims, 4 Drawing Figures

PATENTED NOV 28 1972 3,704,384

MONOLITHIC CAPACITOR STRUCTURE

BACKGROUND OF THE INVENTION

This disclosure relates to the structure of capacitors for use in monolithic circuits and more particularly to such capacitors combined in circuits with field effect transistors.

In U.S. Pat No. 3,564,290 by G. Y. Sonoda, entitled "Regenerative Source Follower," a field effect transistor is described which has a feedback capacitor connected between its source and gate to regeneratively raise the voltage at the gate as the voltage at the source increases and to thereby permit the use of small potentials at the gate to control large potentials between the source and the drain. This patent describes how this capacitor is formed by allowing the gate of the FET to overlie a portion of the source diffusion of the FET and thereby provide necessary feedback capacitance. While such a capacitor structure is possible in many of the processes employed in fabricating FET circuits, it is not possible to use this structure with other processes such as the silicon gate process. In the manufacture of an FET by the silicon gate process a layer of silicon is placed down over a thin insulating layer onto a silicon substrate. The silicon and insulating layers are then etched away in the areas where the source and drain diffusions for the FET are to be applied to the substrate. Once the diffusions are made and the manufacturing process is completed, the silicon layer is used as the gate for the FET. Thus, it can be seen that in the silicon gate process it is extremely difficult for diffusion to underlie the gate of an FET to any great extent. Therefore, constructing the feedback capacitor between the gate and the diffusion in the manner described in the discussed patent is out of the question.

BRIEF DESCRIPTION OF THE INVENTION

Therefore, in accordance with the present invention, a new capacitor structure is formed which is compatible with all known means of fabricating FET transistors including the silicon gate process or, as it is otherwise called, the self aligning gate process. In this new structure, a portion of the silicon layer is left overlying an undiffused area of the substrate. Adjacent this portion of the silicon layer is a diffusion that forms a rectifying junction with the substrate underlying the mentioned silicon layer portion. When a properly poled potential is applied between the diffusion and the silicon layer portion a layer of charge is drawn underneath the gate from the substrate potential. This charge layer neutralizes the rectifying junction of the adjacent diffusion so that the diffusion and the charge layer together form the second plate of the capacitor.

Therefore, it is an object of the invention to provide a new capacitor structure.

It is another object of the invention to provide a capacitor structure to be formed with field effect transistors on monolithic substrates.

It is another object of the invention to provide an improved capacitor structure.

DESCRIPTION OF THE DRAWINGS

These and other objects, features and advantages of the invention will be apparent from the following more particular description of the preferred embodiment of the invention as illustrated in the accompanying drawings, of which.

Figure 1:
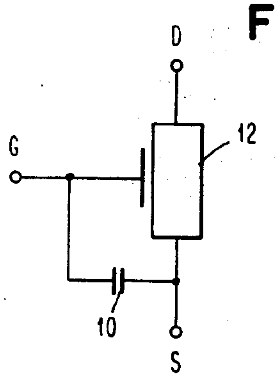
FIG. 1 is an electrical schematic of a combination FET and capacitor circuit.

In many cases it is very desirable to form a capacitor between two terminals of a field effect transistor as, for instance, in FIG. 1 a capacitor 10 is formed between the gate and source terminals of the FET 12. It has usually been the practice to form such a capacitor 10 between the gate and source by having the gate which is a conductor overlie a portion of the source diffusion for the FET so that the gate conductor forms one plate of the capacitor and the source diffusion forms the other plate of the capacitor while the oxide layer between the gate and the source diffusion forms the dielectric for the capacitor.

In some processes, such as the silicon gate process, forming a capacitor in combination with an FET in this manner is not possible. In the silicon gate process a silicon layer is laid down over an oxide layer on a monolithic chip. The silicon layer is then etched away in areas where the drain and source diffusions are to be made and remaining sections of the silicon layer are used as gate areas for the field effect transistor and for connections. It can be seen then that the gates cannot overlie the drain diffusion to any large extent and thus the feedback capacitor 10 cannot be formed in the manner described above where the silicon gate process is used.

Figure 2:
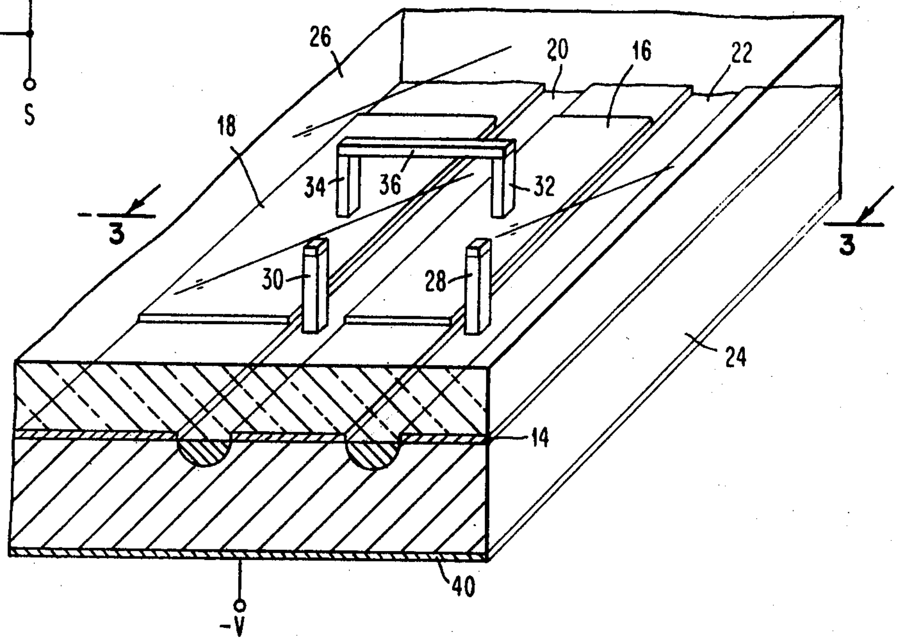
FIG. 2 shows a structure for the circuit of FIG. 1 when it is fabricated in accordance with the present invention.
Figure 3:
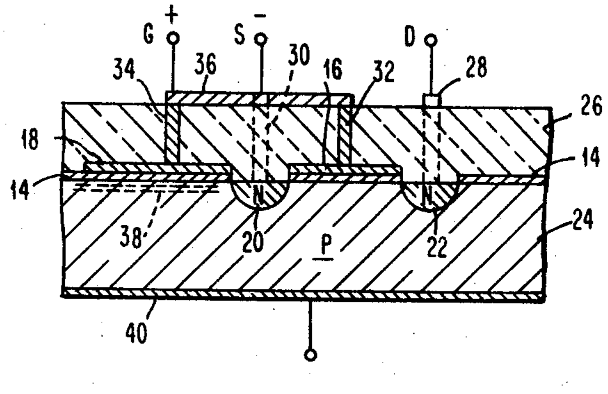
FIG. 3 is a section taken along lines 3—3 in FIG. 1.

In the present invention a capacitor is formed as shown in FIGS. 2 and 3 in a manner compatible with the silicon gate process. The silicon layer overlying the thin oxide layer 14 is split by etching into two sections, one section 16 forming the gate for the field effect transistor 12 and the other section forming one of the plates for the capacitor 10. The oxide layer 14 is then stripped away in two stripes for the receipt of the diffusions for the source and drain. The N type diffusions 20 and 22 are then made into the P type substrate 24 to form the source and drain diffusions respectively. Once the diffusions are complete a thick oxide layer 26 is formed to overlie the whole structure and it is etched to receive metalization to form the metal contacts 28, 30, 32 and 34 to the drain, source, gate and plate respectively. The gate and plate contacts 32 and 34 are joined by a metal strip 36 to make the gate-to-capacitor connection and a negative potential −V is applied to the substrate 24 through a metal layer 40 to provide the substrate bias. Now, when the source terminal 30 is made negative with respect to the gate terminal 32 or 34, charge is drawn under the plate 18 from the −V substrate bias providing a negative charge layer under the plate 18. This negative charge neutralizes the rectifying junction of the source diffusion 20 adjacent the plate 18 so that the source diffusion 20 and the negative charge 38 form a continuous conductive second plate of the capacitor and the thin oxide layer 14 under the plate 18 forms the dielectric for the capacitor.

Figure 4:
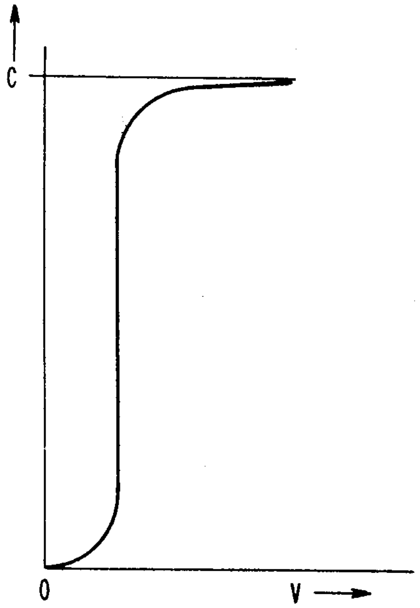
FIG. 4 is a graph of the variation in capacitance with the voltage of a capacitor formed in accordance with the present invention.

The capacitance of this capacitor (between plate 18 and diffusion 20) is a function of the potential and varies in accordance with the curve of FIG. 4. When the potential between the plate 18 and the diffusion 20 is zero the capacitance is negligible. However as the voltage applied between the gate and source is increased the capacitance goes up markedly until some potential is reached where the capacitance levels off. It is found in making capacitors in the manner described above higher capacitances could be obtained than in other ways of making capacitors on monolithic chips.

In fabricating the structure a normal impurity level for FET's can be used. For instance, the P substrate can have impurity concentration of $10^{16}$ impurity/$CM^3$ while diffusions 20 and 22 and conductive layers 16 and 18 can have impurity concentration of $10^{20}$ impurities/$CM^3$. The A.C. current path from the conducting layer 18 to the diffusion 20 is a high impedance due to the presence of the rectifying junction. However, as pointed out above, the negative charge attracted under the conducting plate forms a conductor which lowers the impedance of this path and creates a capacitor between the plate 18 and the diffusion 20.

It should be noted that though this capacitor is described in connection with a silicon gate process, it can be manufactured using other processes and can be used anywhere high capacitance or a polarized capacitor is needed; such additional applications include the enhancement of the storage node capacitance in the A.C. stable storage cells. In the drawing the diffusion 20 runs along only one side of the plate 18. However, if desired the diffusion can extend along more than one side of the plate 18 and can, in fact, surround the plate 18. It can also be divided into two or more sections which are maintained at the potential.

Therefore, while the invention has been shown and described with rspect to a preferred embodiment thereof, it will be understood by those skilled in the art that various changes in form and detail may be made therein without departing from the spirit and scope of the invention.

What is claimed is:

1. In a two terminal capacitor a structure comprising:
a body of semiconductor material of one polarity;
two zones of the other polarity in said body which extend to one surface of the body and form a rectifying junction along the boundaries of said zones in said body so as to form the source and drain of a field effect transistor;
a first thin insulation area over the body in the portion between the two zones to form the insulation on the gate of the field effect transistor;
a second thin insulation layer over another portion of said surface in a second area of the body adjacent one of said zones and where said body is of said one polarity to form the dielectric of the capacitor;
a first conductive layer over the first thin insulation layer to form the gate of the field effect transistor;
a second conductive layer over said second thin insulation layer to form the first plate of the capacitor;
voltage means for applying a potential of the other polarity to the portion of the body which is of the one polarity; and
means for applying an electrical potential between the zone of the other polarity and said conductive layer to draw charge from said voltage means to set up a charge layer under the conductive layer to neutralize a portion of the rectifying junction and with the zone of other polarity form the other plate of the capacitor.

2. The structure of claim 1 wherein said one of the diffusions is the source diffusion for the juxtaposed insulated gate field effect transistor.

* * * * *